US012653040B2

(12) United States Patent
Maruyama et al.

(10) Patent No.: US 12,653,040 B2
(45) Date of Patent: Jun. 9, 2026

(54) SEMICONDUCTOR DEVICE HAVING WIRE PROTECTING PART

(71) Applicant: FUJI ELECTRIC CO., LTD., Kawasaki (JP)

(72) Inventors: Rikihiro Maruyama, Matsumoto-city (JP); Yoshinori Oda, Matsumoto-city (JP); Takahito Harada, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 653 days.

(21) Appl. No.: 18/193,354

(22) Filed: Mar. 30, 2023

(65) Prior Publication Data

US 2023/0343682 A1 Oct. 26, 2023

(30) Foreign Application Priority Data

Apr. 25, 2022 (JP) ................................. 2022-071243

(51) Int. Cl.
*H10W 70/40* (2026.01)
*H10W 72/00* (2026.01)
*H10W 72/50* (2026.01)
*H10W 74/10* (2026.01)

(52) U.S. Cl.
CPC ....... *H10W 70/427* (2026.01); *H10W 70/465* (2026.01); *H10W 70/468* (2026.01); *H10W 72/075* (2026.01); *H10W 72/50* (2026.01); *H10W 72/865* (2026.01); *H10W 72/884* (2026.01); *H10W 74/114* (2026.01); *H10W 74/127* (2026.01)

(58) Field of Classification Search
CPC ............. H10W 70/427; H10W 70/465; H10W 70/468; H10W 74/127; H10W 74/00; H10W 74/114; H10W 72/884; H10W 72/075; H10W 72/50; H10W 72/865
See application file for complete search history.

(56) References Cited

U.S. PATENT DOCUMENTS

| | | | | |
|---|---|---|---|---|
| 5,408,128 A | | 4/1995 | Furnival | |
| 5,559,374 A | * | 9/1996 | Ohta | ....................... H01L 23/13 257/723 |
| 11,626,333 B2 | * | 4/2023 | Higashi | ............... H01L 23/3735 257/694 |
| 11,984,386 B2 | * | 5/2024 | Inokuchi | ............. H01L 23/5385 |

(Continued)

FOREIGN PATENT DOCUMENTS

| | | |
|---|---|---|
| JP | S60178650 A | 9/1985 |
| JP | H07240497 A | 9/1995 |

(Continued)

OTHER PUBLICATIONS

Japanese Patent Office Action issued for corresponding JP Patent Application No. 2022-071243, and its English translation, dated Apr. 7, 2026.

*Primary Examiner* — Alonzo Chambliss
(74) *Attorney, Agent, or Firm* — Rabin & Berdo, P.C

(57) ABSTRACT

A wire protecting part partially encloses a first lead frame and a second lead frame and has an enclosing surface from which the first and second lead frames protrude. The enclosing surface is parallel to semiconductor chips, and includes a water stop part protruding, from the enclosing surface, between the first and second lead frames.

14 Claims, 18 Drawing Sheets

(56)           References Cited

U.S. PATENT DOCUMENTS

2014/0231975 A1      8/2014  Denta et al.
2020/0020622 A1*    1/2020  Kaji ................... H01L 23/3735
2021/0358835 A1    11/2021  Inokuchi
2022/0278008 A1      9/2022  Maeda et al.

FOREIGN PATENT DOCUMENTS

JP          H09148523 A  *  6/1997   ............ H01L 23/34
JP          H11354716 A     12/1999
JP          2004022811 A     1/2004
JP          2014157925 A     8/2014
JP          2021027263 A     2/2021
WO          2021029150 A1    2/2021

* cited by examiner

51

51e

52

52e

51f

51b

51a

51d

51c

52c

52b

52a

52d

35a

35a3    35a1    35a2

6

52    51

51e

40

52e 36    36    4

35

52b

51f

35e

35b

51b

35c

52d 52a    35d    51a

51d

60

52

51

40

52e

35a

35a1

51e

4

35

52b

51f

35e

35b

35c

51b

52d

52a

35d

51a

51d

6

52

51

40

52e

35a

35a1

36

51e

4

35

52b

51f

35e

35b

35c

51b

52d

52a

51a

35d

51d

6

52

35a     35f

35

35a1

51

35e

35b

34b

34c

C     C

Y     Y

36

35g 33b      33c

6

52

51

40

52e

51e 36        35a1        36

4

35

52b

51f

35b 35e        51b        35c

52d

51a 52a        35d

51d

6

52          51

40          52e          51e 36     35a1          4

35     51f 52b          35b 35e          51b          35c 52d          35d 52a          51a

51d

SEMICONDUCTOR DEVICE HAVING WIRE PROTECTING PART

CROSS-REFERENCE TO RELATED APPLICATION

This application is based upon and claims the benefit of priority of the prior Japanese Patent Application No. 2022-071243, filed on Apr. 25, 2022, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices, and are used, for example, as power converters that are configured as inverters. Examples of such power devices are insulated gate bipolar transistors (IGBTs) and power metal oxide semiconductor field effect transistors (MOSFETs). Such semiconductor devices include multiple insulated circuit boards and semiconductor chips including power devices. The semiconductor devices also include multiple lead frames electrically connected to the semiconductor chips. Two lead frames for the main current (main current terminals) are partially enclosed with resin.

International Publication Pamphlet No. WO 2021/029150

Dew condensation occurs on such a semiconductor device depending on its usage environment. Especially, when dew condensation builds up on two lead frames partially enclosed with resin, water droplets from the dew condensation run on the respective lead frames. At this time, if the water droplets run down each of the lead frames, then flow onto an enclosing face of the resin partially enclosing the lead frames, and eventually merge on the enclosing face, the two lead frames will be short-circuited. As a result, a failure occurs, thus decreasing reliability of the semiconductor device.

SUMMARY OF THE INVENTION

According to an aspect, there is provided a semiconductor device, including a first semiconductor chip and a second semiconductor chip; and a wiring unit that includes: a first main current terminal having a first lower end electrically connected to the first semiconductor chip, a second main current terminal having a second lower end electrically connected to the second semiconductor chip, and a wire protecting part enclosing both a part of the first main current terminal and a part of the second main current terminal and having an enclosing surface from which another part of the first main current terminal and another part of the second main current terminal respectively protrude as a first protruding part and a second protruding part, wherein: the enclosing surface is parallel to the first semiconductor chip and the second semiconductor chip, and includes a water stop part which protrudes, from the enclosing surface, between the first main current terminal and the second main current terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings. Note that in the following the terms "front surface" and "top face" refer to an X-Y plane facing upward (the +Z direction) in a semiconductor device 1 of FIG. 1. Similarly, the term "upper" refers to the upward direction (the +Z direction) of the semiconductor device 1 of FIG. 1. On the other hand, the terms "rear surface" and "bottom face" refer to an X-Y plane facing downward (the −Z direction) in the semiconductor device 1 of FIG. 1. Similarly, the term "lower" refers to the downward direction (the −Z direction) of the semiconductor device 1 of FIG. 1. These terms have the same orientational relationships in other drawings if needed. The terms "front surface", "top face", "upper", "rear surface", "bottom face", "lower", and "lateral face" are simply expedient expressions used to specify relative positional relationships, and are not intended to limit the technical ideas of the embodiments described herein. For example, the terms "upper" and "lower" do not necessarily imply the vertical direction to the ground surface. That is, the "upper" and "lower" directions are not defined in relation to the direction of the gravitational force. In addition, the term "major component" in the following refers to a constituent having a concentration equal to 80 vol % or higher.

(a) First Embodiment

Figure 1:
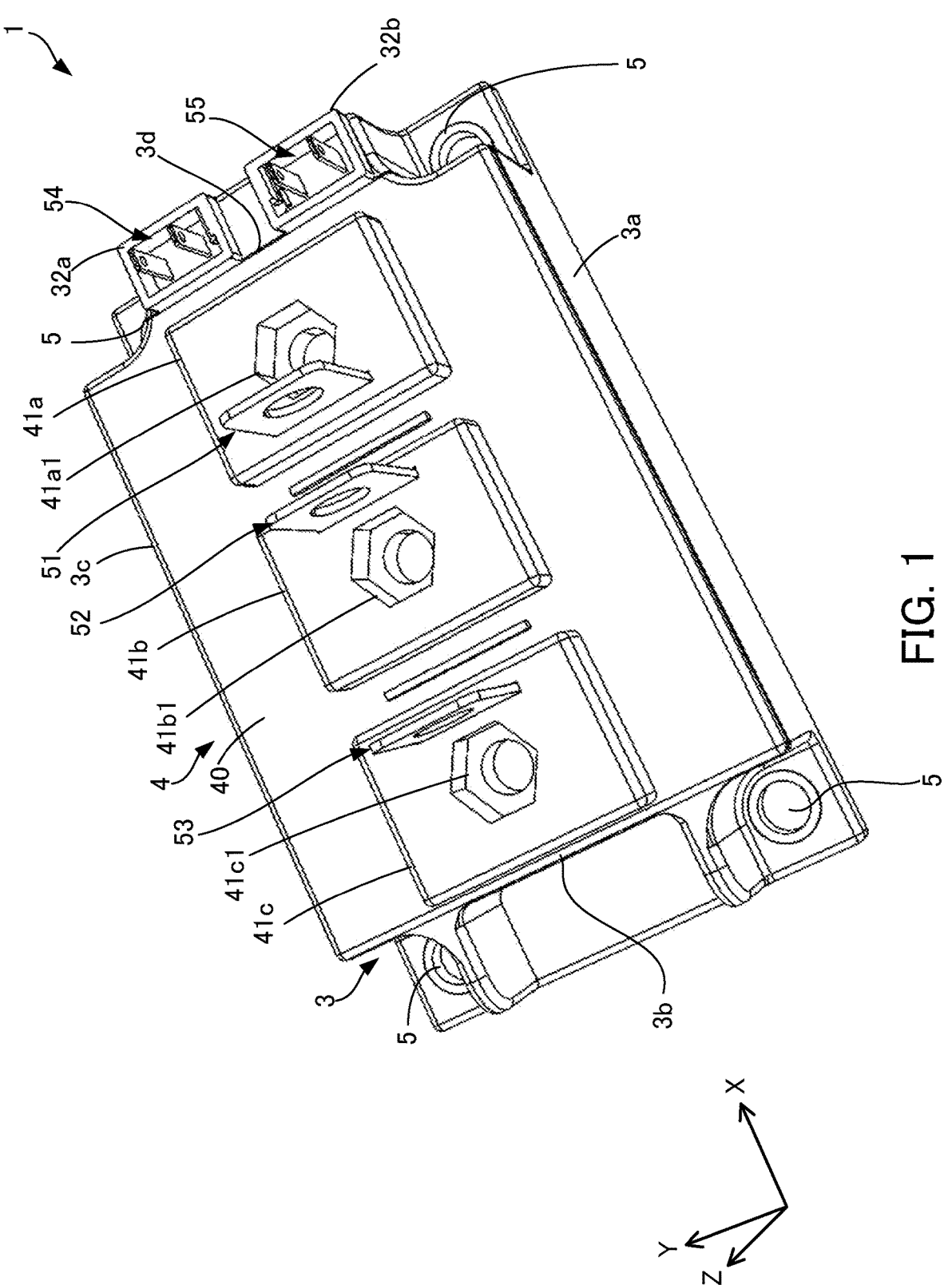
FIG. 1 is an external view of a semiconductor device according to a first embodiment.

The appearance of a semiconductor device of a first embodiment is described with reference to FIG. 1. FIG. 1 is an external view of the semiconductor device according to the first embodiment. In the semiconductor device 1, semiconductor units 2a and 2b described later are housed in a case 3. A heat dissipation base plate 17 having a rectangular shape in plan view is provided on the rear surface of the semiconductor device 1 (the back side of the case 3) (see FIG. 3).

The case 3 includes side walls 3a to 3d and terminal ports 32a and 32b. The case 3 also includes fastener holes 5, individually located at the four corners in plan view. In addition, a lid 4 is attached to the case 3.

The side walls 3a to 3d surround the heat dissipation base plate 17 on all four sides. That is, the side walls 3a to 3d surround the semiconductor units 2a and 2b laid on the heat dissipation base plate 17. Note that the side wall 3b may include a curved surface, having an L shape in lateral view (see FIG. 3). The side walls 3a to 3d are fixed to the heat dissipation base plate 17 with adhesive members. The terminal ports 32a and 32b are provided between two of the fastener holes 5, adjacent to the outer side of the side wall 3d. Control terminals 54 and 55 emerge from the terminal ports 32a and 32b, respectively. The fastener holes 5 are formed in the vicinity of the outer corners of a housing area 31 surrounded by the side walls 3a to 3d. The semiconductor device 1 is placed in a discretionary area and then fixed securely to the area by screws inserted through the fastener holes 5.

The lid 4 includes a lid body 40 and terminal blocks 41a, 41b, an 41c formed in the central region of the lid body along the longitudinal direction (the ±X direction). The lid body 40 has a flat plate-like shape. Specifically, the lid body 40 has a rectangular shape corresponding to the opening surrounded by the side walls 3a to 3d, and has the same area as the opening.

Each of the terminal blocks 41a, 41b, and 41c is cubical in shape. The terminal blocks 41a, 41b, and 41c are integrally formed on the front surface of the lid body 40. On the front surfaces of the terminal blocks 41a, 41b, and 41c, screw holes 41a1, 41b1, and 41c1 are formed, respectively. The screw holes 41a1, 41b1, and 41c1 do not penetrate through the terminal blocks 41a, 41b, and 41c and the lid body 40, and each accommodates a nut therein. From the terminal blocks 41a, 41b, and 41c, first, second, and third lead frames 51, 52, and 53, which are examples of main current terminals, extend vertically upward (the +Z direction). Note that FIG. 1 merely depicts a case where the first, second, third lead frames 51, 52, and 53 extend vertically upward. These extending first, second, and third lead frames 51, 52 and 53 are respectively bent toward the front surfaces of the terminal blocks 41a, 41b, and 41c. Opening holes formed in the bent first, second, third lead frames 51, 52, and 53 oppose the screw holes 41a1, 41b1, and 41c1, respectively. For example, external terminals are inserted through the opening holes of the first, second, and third lead frames 51, 52, and 53, and the nuts housed in the screw holes 41a1, 41b1, and 41c1 are tightened over screws. Herewith, the individual external terminals are mechanically and electrically connected to the first, second, and third lead frames 51, 52, and 53.

Figure 2:
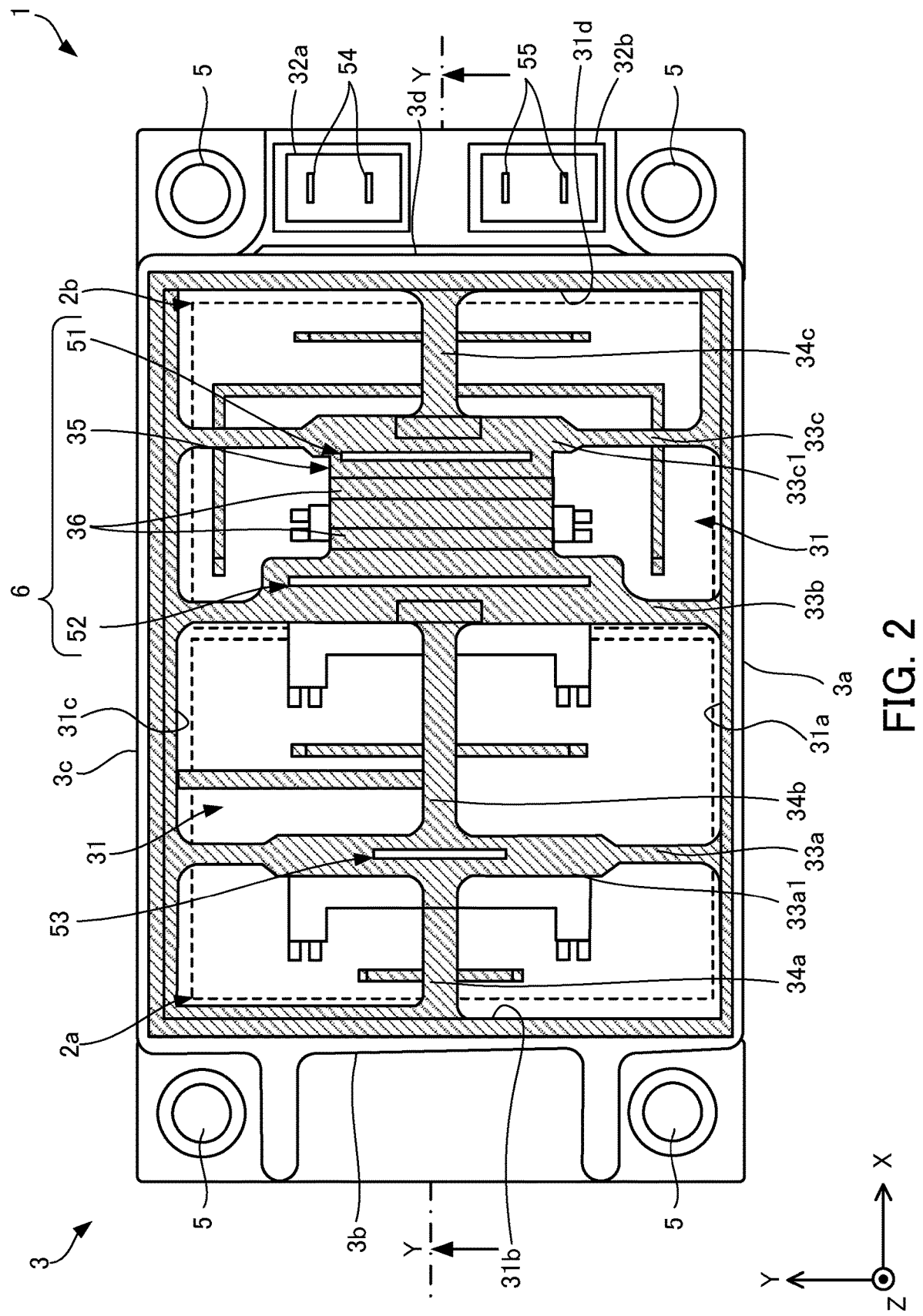
FIG. 2 is a plan view of a case included in the semiconductor device of the first embodiment.
Figure 3:
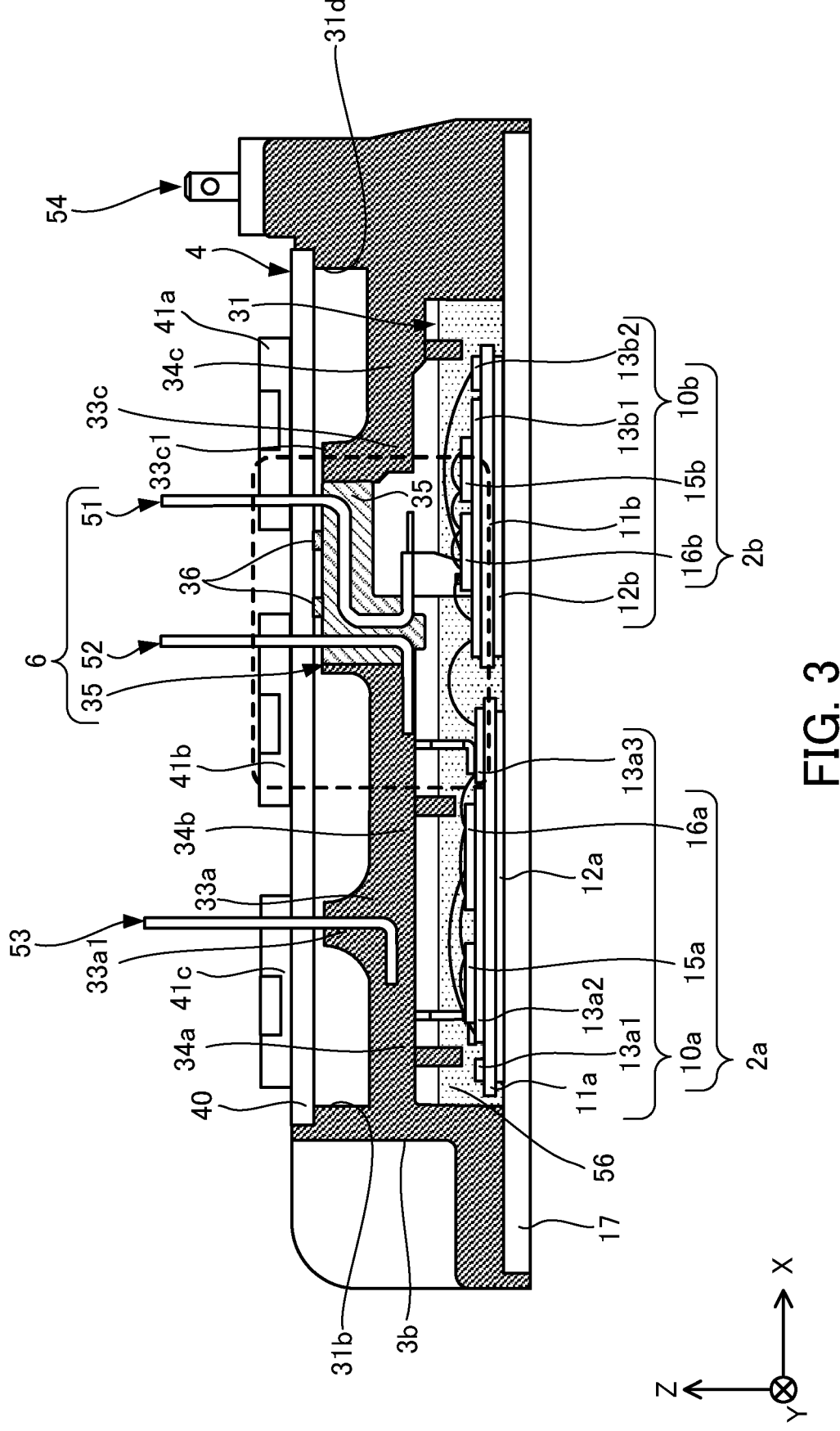
FIG. 3 is a cross-sectional view of the semiconductor device of the first embodiment.

Next described is the inside of the case 3 with reference to FIGS. 2 and 3. FIG. 2 is a plan view of the case included in the semiconductor device of the first embodiment. FIG. 3 is a cross-sectional view of the semiconductor device of the first embodiment. Note that FIG. 2 is a plan view of the semiconductor device 1, with the lid 4 removed therefrom and a sealing member 56 omitted from the illustration. Note that areas delineated by broken lines in FIG. 2 represent installation sites of the semiconductor units 2a and 2b housed in the case 3. FIG. 3 is a cross-sectional view of the semiconductor device along dashed-dotted line Y-Y of FIG. 2.

The case 3 mainly includes vertical beams 33a, 33b, and 33c and horizontal beams 34a, 34b, and 34c in the housing area 31 surrounded by inner walls 31a to 31d of the side walls 3a to 3d. The vertical beams 33a, 33b, and 33c and the horizontal beams 34a, 34b, and 34c keep the strength of the case 3 above a certain level. The case 3 may include beams other than the vertical beams 33a, 33b, and 33c and the horizontal beams 34a, 34b, and 34c if needed.

The inner walls 31a to 31d are positioned inside the side walls 3a to 3d and sequentially surround the housing area 31 on the four sides. In plan view, the inner walls 31a and 31c correspond to the long sides of the housing area 31 while the inner walls 31b and 31d correspond to the short sides thereof. A step is formed in the upper portion (in the +Z direction) of each of the inner walls 31a to 31d. The lid 4 is fitted to the steps of the inner walls 31a to 31d via an adhesive member.

The vertical beams 33a, 33b, and 33c extend in a vertical direction (the ±Y direction) of FIG. 2. These vertical beams 33a, 33b, and 33c are individually laid perpendicularly to the inner walls 31a and 31c across the housing area 31, connecting the inner walls 31a and 31c. For that matter, the vertical beams 33a, 33b, and 33c each run parallel to the inner walls 31b and 31d.

The vertical beams 33a and 33c include, in their middle sections, terminal enclosing portions 33a1 and 33c1, respectively. The terminal enclosing portion 33a1 is configured to be thick (wide) in the ±X direction at the middle section of the vertical beam 33a. Similarly, the terminal enclosing portion 33c1 is configured to be thick (wide) in the ±X direction at the middle section of the vertical beam 33c. Note that a wire protecting part 35 to be described later is integrally connected to the −X direction side of the middle section of the vertical beam 33c.

The rear surfaces of the terminal enclosing portions 33a1 and 33c1 are flush with the rear surfaces of the vertical beams 33a and 33c. The terminal enclosing portions 33a1 and 33c1 may be configured to be thicker (wider) in the +Z direction than the vertical beams 33a and 33c.

The third lead frame 53 is formed integrally with the terminal enclosing portion 33a1. The upper end of the third lead frame 53 extends vertically upward (in the +Z direction) from the front surface of the terminal enclosing portion 33a1. The lower end of the third lead frame 53 extends vertically downward (in the −Z direction) from the rear surface of the terminal enclosing portion 33a1 and is electrically and mechanically connected to the semiconductor unit 2a to be described later.

In addition, the wire protecting part 35 is integrally formed with the vertical beams 33b and 33c in such a manner as to be sandwiched between them. The wire protecting part 35 includes the first and second lead frames 51 and 52. Note that the first and second lead frames 51 and 52 and the wire protecting part 35 together form a wiring unit 6. Details of the wiring unit 6 are described later.

The horizontal beams 34a, 34b, and 34c extend in a horizontal direction (the ±X direction) of FIG. 2. These horizontal beams 34a, 34b, and 34c are arranged in a straight line with the wire protecting part 35 interposed therebetween in such a manner as to stretch across the housing area 31 and connect the center (in the ±Y direction) of the inner wall 31b and the center (in the ±Y direction) of the inner wall 31d. The horizontal beam 34a connects the center (in the ±Y direction) of the inner wall 31b and the center (in the ±Y direction) of the vertical beam 33a. The horizontal beam 34b connects the center (in the ±Y direction) of the vertical beam 33a and the center (in the ±Y direction) of the vertical beam 33b. The horizontal beam 34c connects the center (in the ±Y direction) of the vertical beam 33c and the center (in the ±Y direction) of the inner wall 31d. The front and rear surfaces of the horizontal beams 34a, 34b, and 34c are flush with those of the vertical beams 33a and 33c.

The above-described case 3 is formed by integral molding using a thermoplastic resin. The lid 4 is also integrally formed using a thermoplastic resin. As such a thermoplastic resin, any of the following may be used: a poly phenylene sulfide (PPS) resin; a polybutylene terephthalate (PBT) resin; a polybutylene succinate (PBS) resin; a polyamide (PA) resin; and an acrylonitrile butadiene styrene (ABS) resin. The lid 4 may be formed separately from the case 3 and then attached to the opening of the side walls 3a to 3d of the case 3 using an adhesive member.

The semiconductor units 2a and 2b are placed side by side on the heat dissipation base plate 17 along the longitudinal direction. The semiconductor units 2a and 2b are covered with the housing area 31 of the case 3 attached to the heat dissipation base plate 17. The semiconductor units 2a and 2b in the housing area 31 are sealed with the sealing member 56. The sealing member 56 only needs to seal the semiconductor units 2a and 2b, and no need to seal the entire housing area 31. The sealing member 56 is, for example, gel.

Figure 4:
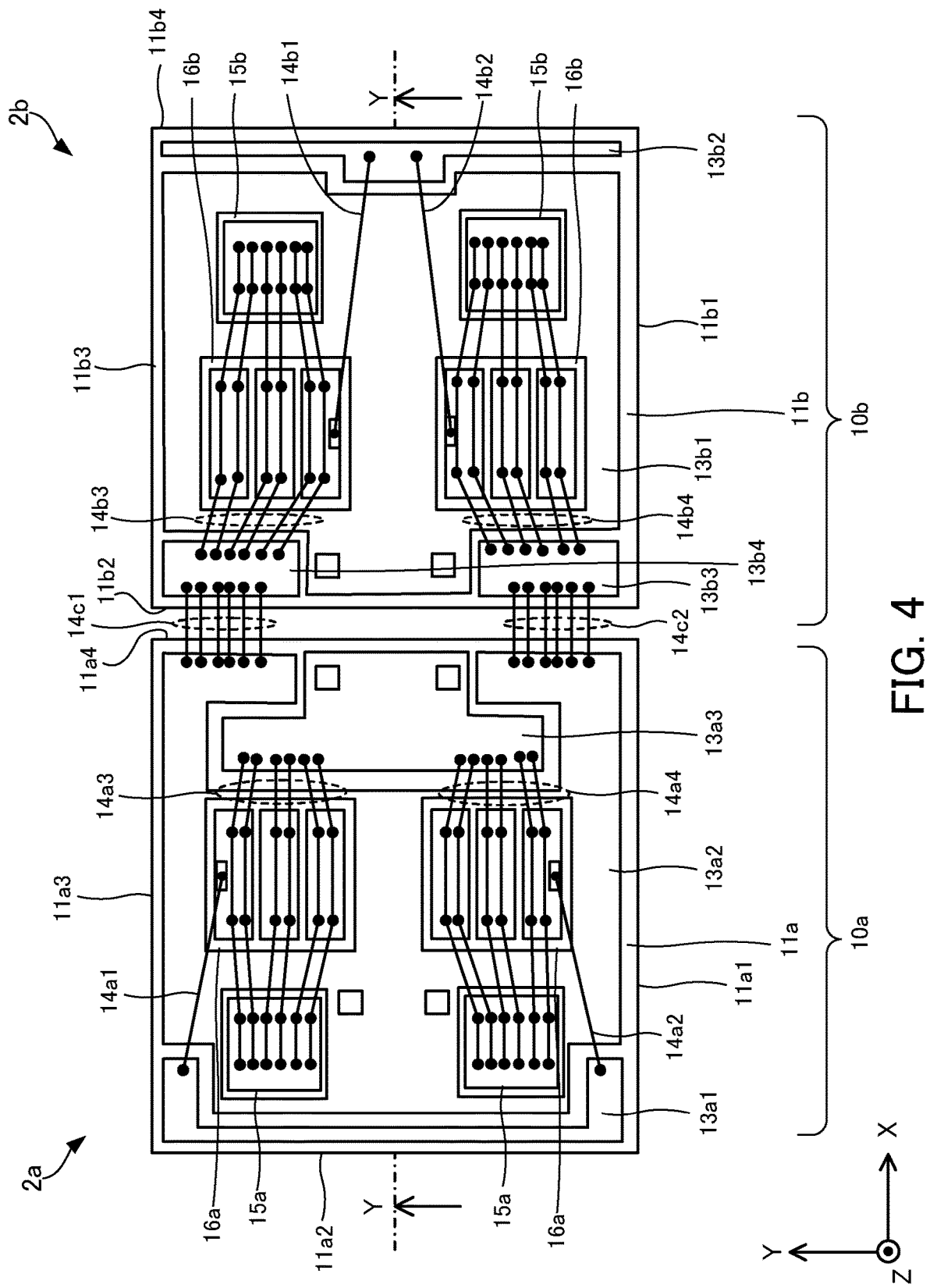
FIG. 4 is a plan view of semiconductor units included in the semiconductor device of the first embodiment.
Figure 5:
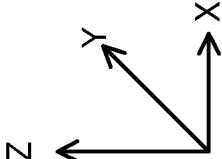
FIG. 5 is a perspective view of lead frames included in the semiconductor device of the first embodiment.

Next described are the semiconductor units 2a and 2b and the first, second, and third lead frames 51, 52, and 53 with reference to FIGS. 4 and 5 (and FIG. 3). FIG. 4 is a plan view of the semiconductor units included in the semiconductor device of the first embodiment. FIG. 5 is a perspective view of lead frames included in the semiconductor device of the first embodiment. Note that FIG. 4 depicts the front surfaces of the semiconductor units 2a and 2b arranged on the heat dissipation base plate 17. The illustration of FIG. 4 omits the heat dissipation base plate 17 and the first, second, and third lead frames 51, 52, and 53. FIG. 5 represents a perspective view of the first and second lead frames 51 and 52. The third lead frame 53 has a configuration similar to that of the second lead frame 52.

The semiconductor units 2a and 2b include insulated circuit boards 10a and 10b and semiconductor chips 15a, 16a, 15b, and 16b. The first, second, and third lead frames 51, 52, and 53 are connected to these semiconductor units 2a and 2b. In FIG. 4, connection points of the first, second, and third lead frames 51, 52, and 53 are indicated by open squares.

The insulated circuit boards 10a and 10b each have a rectangular shape in plan view, as illustrated in FIG. 4. The insulated circuit boards 10a and 10b include insulating plates 11a and 11b, metal plates 12a and 12b placed on the rear surfaces of the insulating plates 11a and 11b, and multiple wiring boards 13a1 to 13a3 and 13b1 to 13b4 placed on the front surfaces of the insulating plates 11a and 11b. The wiring boards 13a1 to 13a3 and the metal plate 12a have a contour smaller than that of the insulating plate 11a in plan view, and they are each formed inside the insulating plate 11a. Similarly, the wiring boards 13b1 to 13b4 and the metal plate 12b have a contour smaller than that of the insulating plate 11b in plan view, and they are each formed inside the insulating plate 11b. Note that the shapes and number of the multiple wiring boards 13a1 to 13a3 and 13b1 to 13b4 are merely an example.

The insulating plates 11a and 11b have the shape of a parallelogram having four right angles (a rectangle) in plan view. In addition, each corner of the insulating plates 11a and 11b may be chamfered. For example, the insulating plates 11a and 11b may have R- or C-chamfered corners. The insulating plates 11a and 11b are surrounded on four sides by long sides 11a1 and 11b1, short sides 11a2 and 11b2, long sides 11a3 and 11b3, and short sides 11a4 and 11b4, which are outer peripheries. In this embodiment, the rectangular insulating plates 11a and 11b are described as an example of those in the shape of a parallelogram having four right angles; however, the insulating plates 11a and 11b may have the shape of a square instead. The insulating plates 11a and 11b are made of ceramics with high thermal conductivity, whose major component is, for example, aluminum oxide, aluminum nitride, or silicon nitride.

The metal plates 12a and 12b have a rectangular shape in plan view. In addition, the metal plates 12a and 12b may have R- or C-chamfered corners. The metal plates 12a and 12b are smaller in size than the insulating plates 11a and 11b, and formed all over the rear surfaces of the insulating plates 11a and 11b, except for their edges. The metal plates 12a and 12b are made of a metal with excellent thermal conductivity as a major component. The metal is, for example, copper, aluminum, or an alloy containing at least one of these. In order to provide improved corrosion resistance, plating may be applied to coat the metal plates 12a and 12b. In this case, a material used for plating is, for example, nickel, a nickel-phosphorus alloy, or a nickel-boron alloy.

The wiring boards 13a1 to 13a3 and 13b1 to 13b4 are formed all over the surfaces of the insulating plates 11a and 11b, except for their edges. The wiring boards 13a1 to 13a3 and 13b1 to 13b4 are made of a metal with excellent electrical conductivity. The metal is, for example, copper, aluminum, or an alloy containing at least one of these. In order to provide improved corrosion resistance, plating may be applied to coat the surfaces of the wiring boards 13a1 to 13a3 and 13b1 to 13b4. In this case, a material used for plating is, for example, nickel, a nickel-phosphorus alloy, or a nickel-boron alloy. The wiring boards 13a1 to 13a3 and 13b1 to 13b4 are created by forming a metal layer on the front surface of each of the insulating plates 11a and 11b and performing etching or the like on the metal layers. Alternatively, the wiring boards 13a1 to 13a3 and 13b1 to 13b4 preliminarily cut out of a metal plate are pressure bonded to the front surfaces of the insulating plates 11a and 11b. Note that the wiring boards 13a1 to 13a3 and 13b1 to 13b4 are merely examples, and appropriate changes may be made to the number of wiring boards, their shapes, sizes and so on, as needed basis.

The wiring board 13a1 has a U shape in plan view. The wiring board 13a1 spans from the long side 11a1 of the insulating plate 11a to the long side 11a3 along the short side 11a2. The wiring board 13a2 has a substantially rectangular shape in plan view. The −X-direction end of the wiring board 13a2 enters a recess of the wiring board 13a1. The +X-direction end of the wiring board 13a2 extends to the short side 11a4, and the center of the end is recessed toward the central region of the insulating plate 11a. The width of the wiring board 13a2 in the ±Y direction spans from the long side 11a1 to the long side 11a3. The open squares depicted on the wiring board 13a2 in FIG. 4 represent points where the lower end of the third lead frame 53 is connected. The wiring board 13a3 has a T shape in plan view. The wiring board 13a3 is placed in the +X-direction recess of the wiring board 13a2. The open squares depicted on the wiring board 13a3 of FIG. 4 represent points where the lower end of the second lead frame 52 is connected.

The wiring board 13b1 has a substantially rectangular shape in plan view, with a convex portion provided at the −X-direction end closer to the short side 11b2 and a concave portion provided at the +X-direction end closer to the short side 11b4. The width of the wiring board 13b1 in the ±Y direction spans from the long side 11b1 to the long side 11b3 of the insulating plate 11b. The open squares depicted on the wiring board 13b1 in FIG. 4 represent points where the lower end of the first lead frame 51 is connected.

The wiring board 13b2 has a linear shape in plan view, and extends along the short side 11b4 of the insulating plate 11b with a convex portion provided on the side closer to the short side 11b2. The convex portion enters the concave portion of the wiring board 13b1. The wiring boards 13b3 and 13b4 each have a rectangular shape in plan view, and are laid along the short side 11b2 of the insulating plate 11b with the convex portion of the wiring board 13b1 sandwiched therebetween.

As the insulated circuit boards 10a and 10b having the above-described configurations, for example, direct copper bonding (DCB) substrates or active metal brazed (AMB) substrates may be used. The insulated circuit boards 10a and 10b conduct heat generated by the semiconductor chips 15a, 16a, 15b, and 16b to be described later through the wiring boards 13a2 and 13b1, the insulating plates 11a and 11b, and the metal plates 12a and 12b to the rear surface of the heat dissipation base plate 17, to thereby dissipate the heat. Each of the insulated circuit boards 10a and 10b is joined to the front surface of the heat dissipation base plate 17 with a bonding member (not illustrated). The bonding members are, for example, solder. The solder used is lead-free solder. The lead-free solder contains, as a major component, at least one alloy selected from, for example, a tin-silver-copper alloy, a tin-zinc-bismuth alloy, a tin-copper alloy, and a tin-silver-indium-bismuth alloy. Further, the solder may include an additive, such as nickel, germanium, cobalt, antimony, or silicon. The inclusion of the additive increases wettability, brightness, and bond strength of the solder, which results in improved reliability.

The semiconductor chips 15a, 16a, 15b, and 16b are mainly made of silicon. The semiconductor chips 15a and 15b include diode elements. The diode elements are, for example, free wheeling diodes (FWDs) such as Schottky barrier diodes (SBDs) or P-intrinsic-N (PiN) diodes. The semiconductor chips 15a and 15b each have cathode electrodes as main electrodes (output electrodes) on the rear surface and anode electrodes as main electrodes (input electrodes) on the front surface.

The semiconductor chips 16a and 16b include switching elements. The switching elements are, for example, IGBTs or power MOSFETs. When the semiconductor chips 16a and 16b are IGBTs, each has collector electrodes as main electrodes (input electrodes) on the rear surface, and also has a gate electrode as a control electrode and emitter electrodes as main electrodes (output electrodes) on the front surface. When the semiconductor chips 16a and 16b are power MOSFETs, each has drain electrodes as main electrodes (input electrodes) on the rear surface, and also has a gate electrode as a control electrode and source electrodes as main electrodes (output electrodes) on the front surface.

Note that reverse-conducting IGBTs (RC-IGBTs) having integrated functions of both an IGBT and FWD may be used as the semiconductor chips 16a and 16b. In this case, the semiconductor chips 15a and 15b are not needed.

The semiconductor chips 15a, 16a, 15b, and 16b have their rear surfaces bonded to the predetermined wiring boards 13a2 and 13b1 with bonding members (not illustrated). The bonding members are, for example, the solder described above. Alternatively, metal sintered compacts may be used instead of the solder.

Wires 14a1 to 14a4, 14b1 to 14b4, 14c1, and 14c2 are made of a material with excellent electrical conductivity. The material is, for example, gold, silver, copper, aluminum, or an alloy containing at least one of these. The diameters of the wires 14a1, 14a2, 14b1, and 14b2 are, for example, 110 μm or more and 400 μm or less. On the other hand, the diameters of the wires 14a3, 14a4, 14b3, 14b4, 14c1, and 14c2 are, for example, 300 μm or more and 500 μm or less.

The wires 14a1 and 14a2 mechanically and electrically connect the wiring board 13a1 and the control electrodes of the semiconductor chips 16a. The wires 14a3 and 14a4 mechanically and electrically connect the wiring board 13a3, the output electrodes on the front surfaces of the semiconductor chips 16a, and the input electrodes on the front surfaces of the semiconductor chips 15a.

The wires 14b1 and 14b2 mechanically and electrically connect the wiring board 13b1 and the control electrodes of the semiconductor chips 16b. The wires 14b3 and 14b4 mechanically and electrically connect the wiring boards 13b3 and 13b4, the output electrodes on the front surfaces of the semiconductor chips 16b, and the input electrodes on the front surfaces of the semiconductor chips 15b. The wires 14c1 and 14c2 mechanically and electrically connect the wiring board 13a2 and the wiring boards 13b3 and 13b4.

The first lead frame 51 is an example of the first main current terminal, and a first horizontal portion 51a and a first vertical portion 51b are bent in an L shape at a first bent portion 51c, as illustrated in FIG. 5. Specifically, one edge of the first horizontal portion 51a and one edge of the first vertical portion 51b are connected by the first bent portion 51c. The first horizontal portion 51a extends, from the first bent portion 51c, parallel to the main surface (the X-Y plane) of the insulated circuit board 10b in the direction opposite to the second lead frame 52 (i.e., in the +X direction).

The first horizontal portion 51a is flush with a second horizontal portion 52a. The first vertical portion 51b extends, from the first bent portion 51c, upward (in the +Z direction) perpendicular to the main surface (the X-Y plane) of the insulated circuit board 10b. Specifically, the main surface of the first vertical portion 51b is parallel to the main surface of a second vertical portion 52b and situated at a predetermined distance with a gap therebetween. The gap between the main surface of the second vertical portion 52b and the main surface of the first vertical portion 51b may be set according to the current and voltage applied to the first lead frame 51 and the second lead frame 52. If the gap is too small, the insulation between the first lead frame 51 and the second lead frame 52 may be reduced, resulting in a short circuit. If the gap is too large, on the other hand, the inductance fails to be reduced. The width (the length in the ±Y direction) of the first vertical portion 51*b* is smaller than the width (the length in the ±Y direction) of the second vertical portion 52*b*. These first and second vertical portions 51*b* and 52*b* are positioned in such a manner as to have broken lines C-C, which are their center lines perpendicular to the width direction, coinciding with each other in plan view (see FIG. 7). As for the width relationship between the first and second vertical portions 51*b* and 52*b*, the width (the length in the ±Y direction) of the second vertical portion 52*b* and the width (the length in the ±Y direction) of the first vertical portion 51*b* may be different from the above.

Further, the first lead frame 51 includes a first leg portion 51*d*, a first external connection portion 51*e*, and a coupling portion 51*f*. The first horizontal portion 51*a* and the first vertical portion 51*b* are provided at a predetermined height in the height direction (the +Z direction) between the insulated circuit board 10*b* and the lid 4 of the case 3. As described above, the first lead frame 51 has a first end mechanically and electrically connected to the wiring board 13*b*1 and a second end extending outside from the lid 4 of the case 3. The first leg portion 51*d* extends downward (the −Z direction) from other edges of the first horizontal portion 51*a* and includes the aforementioned first end connected to the wiring board 13*b*1. The first external connection portion 51*e* extends further upward (in the +Z direction) than the first vertical portion 51*b* with respect to the insulated circuit board 10*b*, and includes the aforementioned second end extending outside from the lid 4 (the terminal block 41*a*) of the case 3. Note that FIG. 5 depicts the case where the first external connection portion 51*e* extends upward. The first external connection portion 51*e* may be exposed outside from the lid 4 and bent at the broken line to extend, in the direction opposite to the second lead frame 52 (i.e., in the +X direction), parallel to the top face of the lid 4 (the terminal block 41*a*). The coupling portion 51*f* extends from the first vertical portion 51*b* in a direction away from the second vertical portion 52*b*. Specifically, the coupling portion 51*f* is parallel to the first horizontal portion 51*a* and connects the upper edge of the first vertical portion 51*b* and the lower edge of the first external connection portion 51*e*. Therefore, the first and second external connection portions 51*e* and 52*e* are spaced apart by a distance obtained by summing the gap between the first and second vertical portions 51*b* and 52*b* and the length of the coupling portion 51*f*. Note that at least the first horizontal portion 51*a*, the first vertical portion 51*b*, the coupling portion 51*f*, and the first external connection portion 51*e* of the first lead frame 51 each have a flat plate-like shape.

When the first external connection portion 51*e* of the first lead frame 51 and a second external connection portion 52*e* of the second lead frame 52 described later are sufficiently close, or when the inductance due to the gap therebetween is sufficiently small, the first lead frame 51 is not needed to include the coupling portion 51*f*. That is, the first lead frame 51 in this case has the first external connection portion 51*e* and the first vertical portion 51*b* integrally connected to each other, as in the case of the second external connection portion 52*e* and the second vertical portion 52*b* of the second lead frame 52 to be described later.

The second lead frame 52 is an example of the second main current terminal, and the second horizontal portion 52*a* and the second vertical portion 52*b* are bent in an L shape at a second bent portion 52*c*, as illustrated in FIG. 5. Specifically, one edge of the second horizontal portion 52*a* and one edge of the second vertical portion 52*b* are connected by the second bent portion 52*c*. The second horizontal portion 52*a* extends, from the second bent portion 52*c*, parallel to the main surface (the X-Y plane) of the insulated circuit board 10*a* in the direction opposite to the first lead frame 51 (i.e., in the −X direction). The second vertical portion 52*b* extends, from the second bent portion 52*c*, upward (in the +Z direction) perpendicular to the main surface (the X-Y plane) of the insulated circuit board 10*a*.

The second lead frame 52 includes a second leg portion 52*d* and a second external connection portion 52*e*. The second horizontal portion 52*a* and the second vertical portion 52*b* are provided at a predetermined height in the height direction (the +Z direction) between the insulated circuit board 10*a* and the lid 4 of the case 3. As described above, the second lead frame 52 has a first end mechanically and electrically connected to the wiring board 13*a*3 and a second end extending outside from the lid 4 (the terminal block 41*b*) of the case 3. The second leg portion 52*d* extends downward (the −Z direction) from other edge of the second horizontal portion 52*a* and includes the aforementioned first end connected to the wiring board 13*a*3. The second external connection portion 52*e* extends further upward (in the +Z direction) from the other edge of the second vertical portion 52*b* with respect to the insulated circuit board 10*a*, and includes the aforementioned second end extending outside from the lid 4 (the terminal block 41*b*) of the case 3. Note that FIG. 5 depicts the case where the second external connection portion 52*e* extends upward. The second external connection portion 52*e* may be exposed outside from the lid 4 and bent at the broken line to extend, in the direction opposite to the first lead frame 51 (i.e., in the −X direction), parallel to the top face of the lid 4 (the terminal block 41*b*). Note that at least the second horizontal portion 52*a*, the second vertical portion 52*b*, and the second external connection portion 52*e* of the second lead frame 52 each have a flat plate-like shape.

Figure 6:
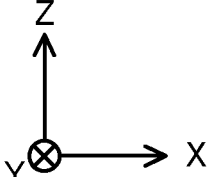
FIG. 6 is a cross-sectional view of a wiring unit included in the semiconductor device of the first embodiment.
Figure 7:
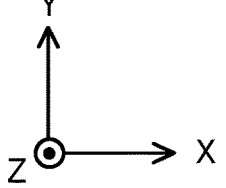
FIG. 7 is a plan view of the wiring unit included in the semiconductor device of the first embodiment.

The wire protecting part 35 partially enclosing the first and second lead frames 51 and 52 is described next with reference to FIGS. 6 and 7. FIG. 6 is a cross-sectional view of a wiring unit included in the semiconductor device of the first embodiment. FIG. 7 is a plan view of the wiring unit included in the semiconductor device of the first embodiment. Note that FIG. 6 is a cross-sectional view of the wiring unit along dashed-dotted line Y-Y of FIG. 7. FIG. 7 provides an enlarged view of the periphery including the wiring unit 6 of FIG. 2. Note that FIG. 6 omits illustration of the horizontal beams 34*b* and 34*c*.

The wiring unit 6 includes the first and second lead frames 51 and 52 and the wire protecting part 35 partially enclosing the first and second lead frames 51 and 52. The lower end of the first lead frame 51 is electrically connected to the semiconductor chips 16*b*. Specifically, the first lead frame 51 is electrically connected to the input electrodes on the rear surfaces of the semiconductor chips 16*b* via the wiring board 13*b*1. The lower end of the second lead frame 52 is electrically connected to the semiconductor chips 16*a*. Specifically, the second lead frame 52 is electrically connected to the output electrodes on the front surfaces of the semiconductor chips 16*a* via the wiring board 13*a*3 and the wires 14*a*3 and 14*a*4.

The wire protecting part 35 encloses both a part of the first lead frame 51 and a part of the second lead frame 52. The wire protecting part 35 also includes an enclosing face (surface) 35a, a front face 35b, an underside face 35c, a bottom face 35d, a rear face 35e, and lateral faces 35f and 35g.

The enclosing face 35a is the front surface of the wire protecting part 35 and opposes the rear surface of the lid 4. The enclosing face 35a includes first and second edge faces 35a2 and 35a3 and an intermediate face 35a1. The first and second edge faces 35a2 and 35a3 and the intermediate face 35a1 are flush with each other. The first and second edge faces 35a2 and 35a3 are integrally connected to the front (in the +X direction) and rear (in the −X direction) of the intermediate face 35a1, respectively. From the first and second edge faces 35a2 and 35a3, the first and second lead frames 51 and 52 enclosed by the wire protecting part 35 protrude vertically upward (in the +Z direction). Specifically, the first and second external connection portions 51e and 52e of the first and second lead frames 51 and 52 protrude above the first and second edge faces 35a2 and 35a3. In this connection, in the first and second lead frames 51 and 52 (the first and second external connection portions 51e and 52e thereof), parts protruding from the first and second edge faces 35a2 and 35a3 are first and second protruding parts. The first and second edge faces 35a2 and 35a3 surround the first and second external connection portions 51e and 52e of the first and second lead frames 51 and 52 in plan view. Therefore, the widths (in the ±Y direction) of the first and second edge faces 35a2 and 35a3 are wider than those (in the ±Y direction) of the first and second external connection portions 51e and 52e of the first and second lead frames 51 and 52.

To the intermediate face 35a1, the first and second edge faces 35a2 and 35a3 are integrally connected. The intermediate face 35a1 has a rectangular shape in plan view. The width (in the ±Y direction) of the intermediate face 35a1 may be, for example, smaller than the widths (in the ±Y direction) of the first and second edge faces 35a2 and 35a3. The intermediate face 35a1 is parallel to the coupling portion 51f of the first lead frame 51. In other words, the intermediate face 35a1 opposes the coupling portion 51f. The intermediate face 35a1 includes water stop parts 36 projecting from the intermediate face 35a1 (toward the lid 4 in the +Z direction) between the first and second lead frames 51 and 52. The water stop parts 36 are laid across the intermediate face 35a1, parallel to the width direction (the ±Y direction) of the first and second external connection portions 51e and 52e of the first and second lead frames 51 and 52. The water stop parts 36 each oppose, recede from, and run parallel to the first and second external connection portions 51e and 52e of the first and second lead frames 51 and 52. The water stop parts 36 may have a columnar shape stretching uninterruptedly in the width direction (the ±Y direction). In this case, the columnar shape may have a quadrangular, triangular, or semicircular cross section perpendicular to the width direction (the ±Y direction). The top parts of the water stop parts 36 may be flush with the top parts of the terminal enclosing portions 33a1 and 33c1. This allows the water stop parts 36 to support the rear surface of the lid 4 together with the terminal enclosing portions 33a1 and 33c1. At least two water stop parts 36 are needed, as illustrated in FIGS. 6 and 7; however, multiple water stop parts 36 may be provided (parallel to each other).

The front face 35b is provided in the front part (in the +X direction) of the wire protecting part 35. The front face 35b is integrally connected to the front edge (in the +X direction) of the enclosing face 35a and extends vertically downward (the −Z direction) from the edge. The front face 35b is parallel to the first and second vertical portions 51b and 52b of the first and second lead frames 51 and 52.

The underside face 35c is provided on the underside of the wire protecting part 35. The underside face 35c is integrally connected to the lower edge of the front face 35b, and extends backward (in the −X direction) from the lower edge and then vertically downward (in the −Y direction) from the middle. The underside face 35c has an L shape in lateral view.

The underside face 35c opposes the coupling portion 51f and the first vertical portion 51b of the first lead frame 51. The bottom face 35d is provided on the bottom surface of the wire protecting part 35. The bottom face 35d is integrally connected to the lower edge of the underside face 35c and extends backward (in the −X direction) from the lower edge.

The rear face 35e is provided in the rear part (in the −X direction) of the wire protecting part 35. The rear face 35e is integrally connected to the rear edge (in the −X direction) of the bottom face 35d, and extends vertically upward (in the +Z direction) from the edge to be then integrally connected to the rear edge (in the −X direction) of the enclosing face 35a. The rear face 35e is parallel to the first and second vertical portions 51b and 52b of the first and second lead frames 51 and 52. The lateral faces 35f and 35g cover the sides of the first and second vertical portions 51b and 52b. In plan view, the lateral faces 35f and 35g cover these sides along the first and second edge faces 35a2 and 35a3 and the intermediate face of the enclosing face 35a.

Figure 8:
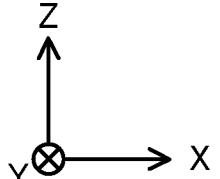
FIG. 8 is a cross-sectional view of a wiring unit included in a semiconductor device of a reference example.

Next described is a wiring unit of a reference example with reference to FIG. 8. FIG. 8 is a cross-sectional view of the wiring unit included in a semiconductor device of the reference example. A wiring unit 60 of FIG. 8 represents the case where no water stop parts 36 are provided in the wiring unit 6 of the first embodiment. Apart from this point, the wiring unit 60 of FIG. 8 has the same configuration as the wiring unit 6 of the first embodiment. Note that the illustration of FIG. 8 also omits the horizontal beams 34b and 34c.

Dew condensation may occur in the semiconductor device 1 including the wiring unit 60 depending on the usage environment. In particular, water droplets from dew condensation may adhere to the first and second lead frames 51 and 52. Note that the case where water droplets adhere to the first and second lead frames 51 and 52 due to factors other than dew condensation is also included here. In such a case, the water droplets run on the first and second lead frames 51 and 52, and then spread over the enclosing face 35a of the wire protecting part 35. If the water traveling on the enclosing face 35a spreads to the opposing first and second lead frames 51 and 52, the first and second lead frames 51 and 52 are short-circuited by the water. As a result, the wiring unit 60 is damaged, thus decreasing reliability of the semiconductor device 1.

In view of the above, the semiconductor device 1 described above includes the semiconductor chips 15a and 16a, the semiconductor chips 15b and 16b, and the wiring unit 6. The wiring unit 6 includes the first and second lead frames 51 and 52 and the wire protecting part 35. The first and second lead frames 51 and 52 have lower ends that are electrically connected to the semiconductor chips 16a and 16b. The wire protecting part 35 encloses part of the first and second lead frames 51 and 52 and has the enclosing face 35a from which the first and second lead frames 51 and 52 protrude. The enclosing face 35a is parallel to the semiconductor chips 15a and 16a and the semiconductor chips 15b and 16b, and includes the water stop parts 36 which protrude, from the enclosing face 35a, between the first and second lead frames 51 and 52. In this case, water having run on the first and second lead frames 51 and 52 spreads over the enclosing face 35*a*. However, the water stop parts 36 stop the water spread on the enclosing face 35*a* from moving toward the opposing first and second lead frames 51 and 52. Therefore, a short circuit between the first and second lead frames 51 and 52 is prevented, thus suppressing the loss of reliability of the semiconductor device 1.

The water stop parts 36 may be made of the same material as the wire protecting part 35 and integrally formed with the enclosing face 35*a*. Alternatively, the water stop parts 36 may be made of a material different from that of the wire protecting part 35. In this case, after the case 3 including the wiring unit 6 is formed, the water stop parts 36 may be added to the enclosing face 35*a* of the wire protecting part 35.

In the first embodiment, the first and second lead frames 51 and 52 each having a flat plate-like shape are given as an example of the main current terminals. As for the main current terminals, for example, at least the portions protruding from the enclosing face 35*a* may be columnar, such as a polygonal column (a triangular column, quadrangular column, etc.) or a cylindrical column. Such columnar main current terminals may be each formed on any of the first and second edge faces 35*a*2 and 35*a*3 in plan view. For example, the main current terminals may be individually arranged on the first and second edge faces 35*a*2 and 35*a*3 in a straight line with the horizontal beams 34*b* and 34*c*.

Modification 1-1

Figure 9:
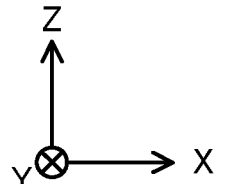
FIG. 9 is a cross-sectional view of a wiring unit included in the semiconductor device of the first embodiment (modification 1-1)
Figure 10:
FIG. 10 is a plan view of the wiring unit included in the semiconductor device of the first embodiment (modification 1-1)
Figure 10:
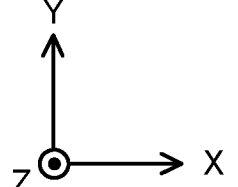

Next, the water stop parts 36 different from those of FIGS. 6 and 7 are described as a modification 1-1 with reference to FIGS. 9 and 10. FIG. 9 is a cross-sectional view of a wiring unit included in the semiconductor device of the first embodiment (the modification 1-1). FIG. 10 is a plan view of the wiring unit included in the semiconductor device of the first embodiment (the modification 1-1). Note that FIG. 9 is a cross-sectional view of the wiring unit along dashed-dotted line Y-Y of FIG. 10. FIG. 9 omits illustration of the horizontal beams 34*b* and 34*c*.

The wiring unit 6 of the modification 1-1 has the same configuration as the wiring unit 6 of FIGS. 6 and 7, except the water stop parts 36. On the enclosing face 35*a* of the modification 1-1, a single water stop part 36 is laid in the middle of the intermediate face 35*a*1, stretching parallel to the first and second lead frames 51 and 52 and across the intermediate face 35*a*1 in the width direction (i.e., the ±Y direction). That is, both edges of the water stop part 36 in the ±X direction recede from the first and second lead frames 51 and 52.

The water stop part 36 in this configuration is also able to prevent water droplets having run down the first and second lead frames 51 and 52 from moving over the enclosing face 35*a* toward the second and first lead frames 52 and 51. Note here that the water stop part 36 of the modification 1-1 needs to be long (in the ±X direction) enough to ensure prevention of leakage of water droplets to be stopped. The length of such a water stop part 36 needs to be, for example, 50% or more of the length (in the ±X direction) of the intermediate face 35*a*1.

Modification 1-2

Figure 11:
FIG. 11 is a cross-sectional view of a wiring unit included in the semiconductor device of the first embodiment (modification 1-2)
Figure 11:
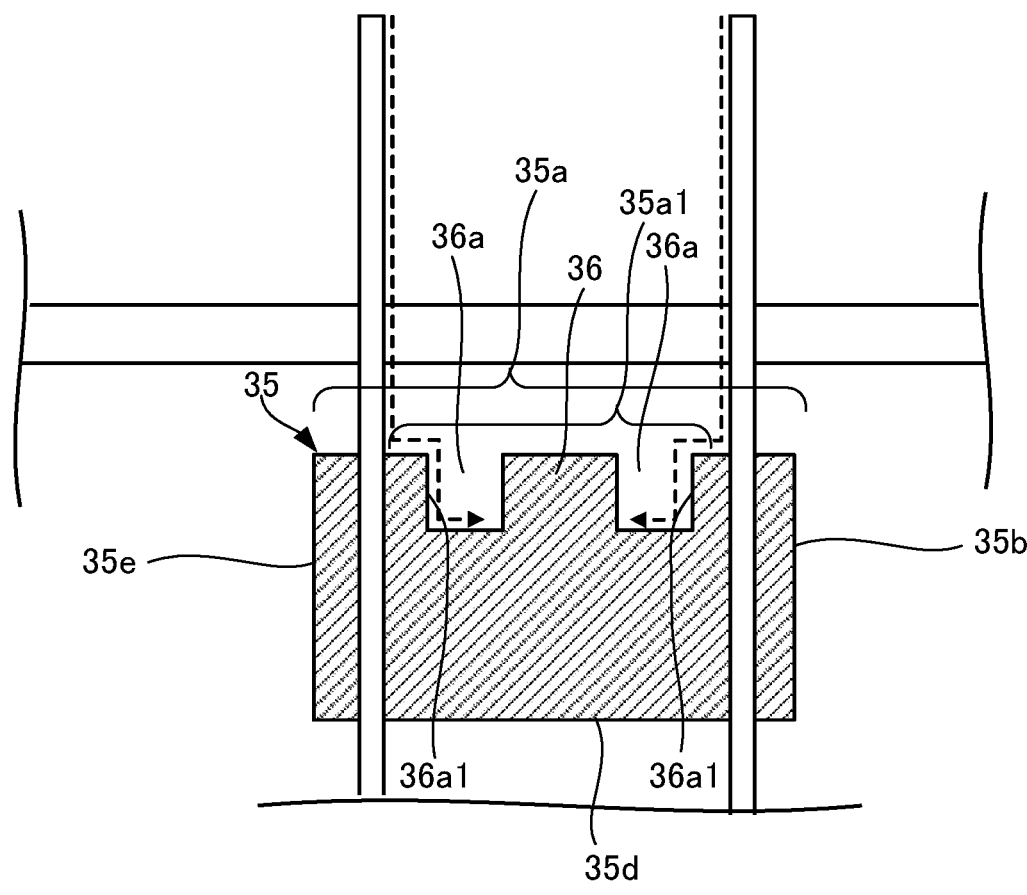
Figure 11:
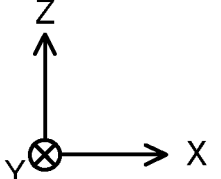
Figure 12:
FIG. 12 is a plan view of the wiring unit included in the semiconductor device of the first embodiment (modification 1-2)
Figure 12:
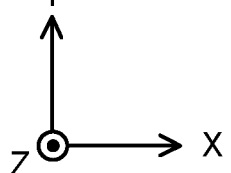

The wiring unit 6 of a modification 1-2 is described with reference to FIGS. 11 and 12. FIG. 11 is a cross-sectional view of a wiring unit included in the semiconductor device of the first embodiment (the modification 1-2). FIG. 12 is a plan view of the wiring unit included in the semiconductor device of the first embodiment (the modification 1-2). Note that FIG. 11 is a cross-sectional view of the wiring unit along dashed-dotted line Y-Y of FIG. 12. FIG. 11 omits illustration of the horizontal beams 34*b* and 34*c*.

As for the first and second lead frames 51 and 52 included in the wiring unit 6 of the modification 1-2, at least portions enclosed by the wire protecting part 35 have a flat plate-like shape and oppose each other in parallel. This is, for example, the case where the first lead frame 51 of FIG. 5 does not include the coupling portion 51*f* and is located sufficiently close to the second lead frame 52, as described above.

Such a wiring protecting part 35 includes the enclosing face 35*a*, the front face 35*b*, the bottom face 35*d*, the rear face 35*e*, and the lateral faces 35*f* and 35*g*. The enclosing face 35*a* includes the first and second edge faces 35*a*2 and 35*a*3 and the intermediate face 35*a*1, as in the first embodiment. From the first and second edge faces 35*a*2 and 35*a*3 (FIGS. 11 and 12 omits these reference numerals), the first and second lead frames 51 and 52 enclosed by the wire protecting part 35 protrude vertically upward (in the +Z direction).

The intermediate face 35*a*1 integrally connects the first and second edge faces 35*a*2 and 35*a*3 and has a rectangular shape in plan view, as in the first embodiment. The intermediate face 35*a*1 includes a depression 36*a* and the water stop part 36 formed in the depression 36*a*. The depression 36*a* runs parallel to the width direction of the intermediate face 35*a*1 (i.e., the ±Y direction), and stretches across the intermediate face 35*a*1 in the width direction. The depression 36*a* may have a substantially flat bottom. Sides 36*a*1 of the depression 36*a* may have a right angle, an obtuse angle, or an acute angle with the bottom. The water stop part 36 is formed in such a manner as to stretch across the bottom of the depression 36*a* in the width direction of the depression 36*a* (the intermediate face 35*a*1) (i.e., in the ±Y direction). A gap is provided between the water stop part 36 and each side 36*a*1 of the depression 36*a*. The water stop part 36 may also have a columnar shape stretching uninterruptedly in the width direction (the ±Y direction). In this case, the columnar shape may have a quadrangular, triangular, or semicircular cross section perpendicular to the width direction (the ±Y direction). The water stop part 36 may be formed integrally with the bottom of the depression 36*a*. In this case, for example, two parallel depressions (with the water stop part 36 interposed therebetween) may be formed on the intermediate face 35*a*1. Alternatively, after the depression 36*a* is formed on the intermediate face 35*a*1, the water stop part 36 separately formed may then be attached to the bottom of the depression 36*a*.

The front face 35*b* is provided in the front part (in the +X direction) of the wire protecting part 35. The front face 35*b* is integrally connected to the front edge (in the +X direction) of the enclosing face 35*a* and extends vertically downward (the −Z direction) from the edge. The front face 35*b* is parallel to the first and second lead frames 51 and 52.

The bottom face 35*d* is provided on the bottom surface of the wire protecting part 35. The bottom face 35*d* is integrally connected to the lower edge of the front face 35*b* and extends backward (in the −X direction) from the lower edge. The first and second lead frames 51 and 52 appear from the bottom face 35*d*, and the first and second leg portions 51*d* and 52*d* extend vertically downward (in the −Z direction) via the first and second horizontal portions 51*a* and 52*a*.

The rear face 35*e* is provided in the rear part (in the −X direction) of the wire protecting part 35. The rear face 35*e* is integrally connected to the rear edge (in the −X direction) of the bottom face 35*d*, and extends vertically upward (in the +Z direction) from the edge to be then integrally connected to the rear edge (in the –X direction) of the enclosing face 35*a*. The rear face 35*e* is parallel to the first and second lead frames 51 and 52.

Also in the semiconductor device 1 including the above-described wiring unit 6, water droplets attached to the first and second lead frames 51 and 52 due to dew condensation flow down onto the enclosing face 35*a* of the wire protecting part 35. Water droplets collected on the enclosing face 35*a* travel over the intermediate face 35*a*1, and then flow into the depression 36*a* and move along the bottom of the depression 36*a*. However, the water stop part 36 prevents the water droplets from moving at the bottom of the depression 36*a*. Therefore, a short circuit between the first and second lead frames 51 and 52 is prevented, thus suppressing the loss of reliability of the semiconductor device 1.

Note that the depth of the depression 36*a* and the length of the water stop part 36 (in the ±X direction) of the modification 1-2 are set so as to ensure prevention of leakage of water droplets to be stopped. For example, when the depression 36*a* is shallow, the water stop part 36 (in the ±X direction) is desirably long. When the depression 36*a* is deep, the length (in the ±X direction) of the water stop part 36 may be short. The top face of the water stop part 36 and the enclosing face 35*a* do not necessarily have to be flush with each other and may be different in height.

In addition, the above-described depression 36*a* and water stop part 36 may also be formed on the wire protecting part 35 including the first and second lead frames 51 and 52 depicted in FIGS. 6 and 7 if there is a sufficient area for the formation of the depression 36*a*.

Modification 1-3

Figure 13:
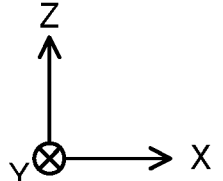
FIG. 13 is a cross-sectional view of a wiring unit included in the semiconductor device of the first embodiment (modification 1-3)
Figure 14:
FIG. 14 is a plan view of the wiring unit included in the semiconductor device of the first embodiment (modification 1-3)
Figure 14:
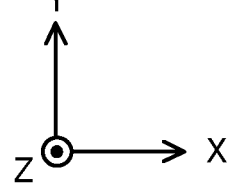

The wiring unit 6 of a modification 1-3 is described with reference to FIGS. 13 and 14. FIG. 13 is a cross-sectional view of a wiring unit included in the semiconductor device of the first embodiment (the modification 1-3). FIG. 14 is a plan view of the wiring unit included in the semiconductor device of the first embodiment (the modification 1-3). Note that FIG. 13 is a cross-sectional view of the wiring unit along dashed-dotted line Y-Y of FIG. 14. FIG. 13 omits illustration of the horizontal beams 34*b* and 34*c*.

The wiring unit 6 of the modification 1-3 has the same configuration as the wiring unit 6 of FIGS. 6 and 7, except the water stop parts 36. On the enclosing face 35*a* of the modification 1-3, the water stop parts 36 are formed to surround the first and second lead frames 51 and 52 in plan view. Specifically, the water stop parts 36 surround the first and second lead frames 51 and 52 in such a manner as to include regions receding from the first and second lead frames 51 and 52 by a certain distance.

Such a water stop part 36 described above may be formed for at least one of the first and second lead frames 51 and 52. FIGS. 13 and 14 depict the case where the water stop parts 36 are formed for both the first and second lead frames 51 and 52. Note that the heights of the water stop parts 36 may be set such that water droplets having run down the first and second lead frames 51 and 52 will not flow over the water stop parts 36.

(b) Second Embodiment

Figure 15:
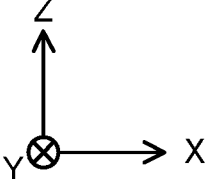
FIG. 15 is a cross-sectional view of a wiring unit included in a semiconductor device of a second embodiment.
Figure 16:
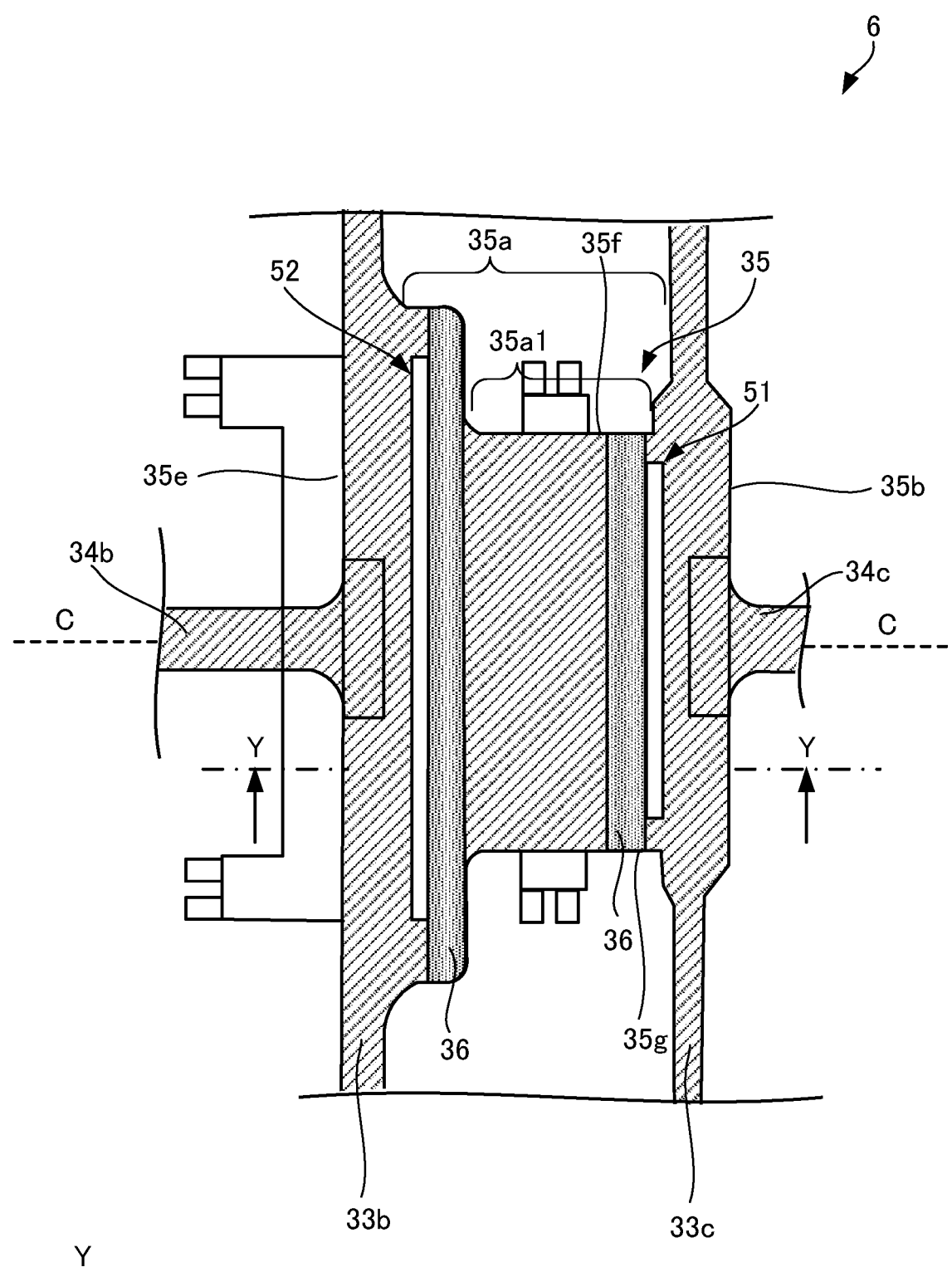
FIG. 16 is a plan view of the wiring unit included in the semiconductor device of the second embodiment.

A second embodiment describes a case where adhesive members are used for the water stop parts, with reference to FIGS. 15 and 16. FIG. 15 is a cross-sectional view of a wiring unit included in a semiconductor device of the second embodiment. FIG. 16 is a plan view of the wiring unit included in the semiconductor device of the second embodiment. FIG. 15 omits illustration of the horizontal beams 34*b* and 34*c*.

In the wiring unit 6 of the second embodiment, the water stop parts 36 included in the wiring unit 6 of the first embodiment are formed of adhesive members. The wiring unit 6 of the second embodiment has the same configuration as the wiring unit 6 of the first embodiment, except for the water stop parts 36. The water stop parts 36 included in the wiring unit 6 of the second embodiment are formed across the width (in the ±Y direction) of the intermediate face 35*a*1 and bind the enclosing face 35*a* and the lid 4 together. In addition, the water stop parts 36 may also adhere to the first and second lead frames 51 and 52. The water stop parts 36 are sandwiched between the enclosing face 35*a* and the rear surface of the lid 4.

Also, in the semiconductor device 1 including the above-described wiring unit 6, water droplets may adhere to the first and second lead frames 51 and 52 due to dew condensation, as described above. The water droplets travel along the first and second lead frames 51 and 52. The water stop parts 36 adhere to the lid 4 and the enclosing face 35*a*. Therefore, when water droplets run along the first and second lead frames 51 and 52 above the lid 4, there is no current path via the surfaces of the water stop parts 36, thus preventing the first and second lead frames 51 and 52 from being short-circuited via the enclosing face 35*a*. Note that, when the water stop parts 36 adhere to the first and second lead frames 51 and 52, no water accumulates between the first and second lead frames 51 and 52, further suppressing the loss of reliability of the semiconductor device 1.

While bonded to the opening surrounded by the inner walls 31*a* to 31*d* of the case 3 with adhesive members, the lid 4 is also bonded to the enclosing face 35*a* with the water stop parts 36. For this reason, the bonding strength of the lid 4 to the case 3 is improved, which makes it difficult for the lid 4 to disengage from the case 3.

Note that, in a configuration different from one depicted in FIGS. 15 and 16, the water stop parts 36 formed of adhesive members may be provided in close contact with the first and second lead frames 51 and 52 in such a manner as to surround them in plan view.

Modification 2-1

Figure 17:
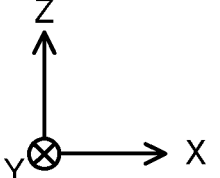
FIG. 17 is a cross-sectional view of a wiring unit included in the semiconductor device of the second embodiment (modification 2-1)
Figure 18:
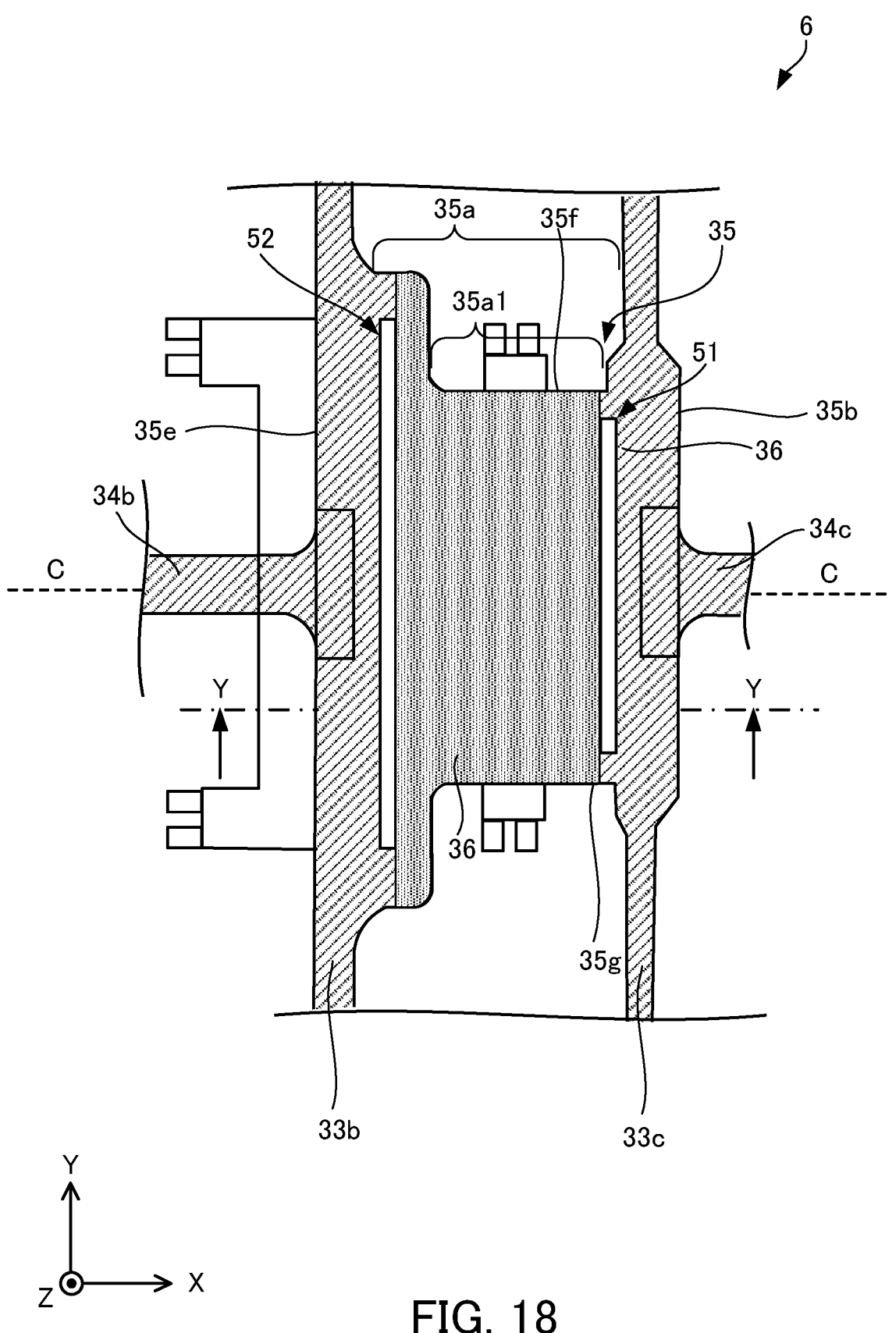
FIG. 18 is a plan view of the wiring unit included in the semiconductor device of the second embodiment (modification 2-1).

The wiring unit 6 of a modification 2-1 is described next, with reference to FIGS. 17 and 18. FIG. 17 is a cross-sectional view of a wiring unit included in the semiconductor device of the second embodiment (the modification 2-1). FIG. 18 is a plan view of the wiring unit included in the semiconductor device of the second embodiment (the modification 2-1). Note that FIG. 17 is a cross-sectional view of the wiring unit along dashed-dotted line Y-Y of FIG. 18. FIG. 17 omits illustration of the horizontal beams 34*b* and 34*c*.

The wiring unit 6 of the modification 2-1 has the same configuration as the wiring unit 6 of FIGS. 15 and 16, except the water stop parts 36. The wiring unit 6 of the modification 2-1 is obtained by burying the water stop part 36 in the wiring unit 6 depicted in FIGS. 15 and 16 in such a manner as to occupy the entire space delineated by the first and second lead frames 51 and 52, the enclosing face 35*a* (the intermediate face 35*a*1), and the lid 4.

Also, in the semiconductor device 1 including the above-described wiring unit 6, water droplets from dew condensation adhere to and then travel along the first and second lead frames 51 and 52, as described above. The water stop part 36 is formed across the width (in the ±Y direction) of the intermediate face 35*a*1 to fill in the void between the first and second lead frames 51 and 52 and be buried between the lid 4 and the enclosing face 35*a*. That is, the water stop part 36 binds the enclosing face 35*a* and the lid 4 together. The water stop part 36 may also adhere to the first and second lead frames 51 and 52. In this case, water droplets running down the first and second lead frames 51 and 52 and passing through the lid 4 are better prevented by the water stop part 36. Therefore, water hardly stays on the enclosing face 35*a*, thus not creating a short circuit between the first and second lead frames 51 and 52 over the enclosing face 35*a*. In turn, prevention of a short circuit between the first and second lead frames 51 and 52 suppresses the loss of reliability of the semiconductor device 1.

The water stop part 36 is buried to fill in the void delineated by the first and second lead frames 51 and 52, the lid 4, and the enclosing face 35*a*. That is, the water stop part 36 adheres to the lid 4 and the enclosing face 35*a*. Therefore, when water droplets run on the first and second lead frames 51 and 52 sticking up on the lid 4, there is no current path via the surface of the water stop part 36, thus preventing the first and second lead frames 51 and 52 from being short-circuited over the enclosing face 35*a*. Note that, when the water stop part 36 adheres to the first and second lead frames 51 and 52, no water accumulates between the first and second lead frames 51 and 52, further suppressing the loss of reliability of the semiconductor device 1. For this reason, the bonding strength of the lid 4 to the case 3 is improved compared to the second embodiment, which makes it difficult for the lid 4 to disengage from the case 3.

According to the disclosed techniques, even if water droplets adhere to the lead frames (the main current terminals), a short circuit and resultant damage on the semiconductor device are prevented, thus suppressing the loss of reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a first semiconductor chip and a second semiconductor chip; and
a wiring unit that includes:
    a first main current terminal having a first lower end electrically connected to the first semiconductor chip,
    a second main current terminal having a second lower end electrically connected to the second semiconductor chip, and
    a wire protecting part enclosing both a part of the first main current terminal and a part of the second main current terminal and having an enclosing surface from which an other part of the first main current terminal and an other part of the second main current terminal respectively protrude as a first protruding part and a second protruding part, wherein:
    the enclosing surface is parallel to the first semiconductor chip and the second semiconductor chip, and includes a water stop part which protrudes, from the enclosing surface, between the first main current terminal and the second main current terminal.

2. The semiconductor device according to claim 1, wherein the first and second protruding parts respectively have a first surface and a second surface that face each other.

3. The semiconductor device according to claim 2, wherein respective cross sections of the first and second protruding parts each have a columnar shape.

4. The semiconductor device according to claim 2, wherein the first and second protruding parts each have a flat plate shape that has a flat plate face, the flat plate faces of the first and second protruding parts being the first and second surfaces that face each other.

5. The semiconductor device according to claim 4, wherein the water stop part extends in a width direction of the first main current terminal and the second main current terminal to be across the enclosing surface.

6. The semiconductor device according to claim 5, wherein the enclosing surface has a recess that extends in the width direction to be across the enclosing surface, and the water stop part is located at a bottom of the recess.

7. The semiconductor device according to claim 5, wherein the water stop part is provided in plurality.

8. The semiconductor device according to claim 5, wherein the water stop part is made of a same material as the wire protecting part and is integral with the wire protecting part.

9. The semiconductor device according to claim 4, wherein the water stop part includes a portion protruding from the enclosing surface between the first and second protruding parts and surrounding at least one of the first protruding part or the second protruding part.

10. The semiconductor device according to claim 1, further comprising a lid provided above the wiring unit, wherein the first and second protruding parts respectively penetrate through and protrude from the lid.

11. The semiconductor device according to claim 10, wherein the water stop part is an adhesive member that is sandwiched between the enclosing surface and a rear surface of the lid.

12. The semiconductor device according to claim 11, wherein the water stop part is provided in close contact with at least one of the first protruding part or the second protruding part.

13. The semiconductor device according to claim 12, wherein the water stop part is provided as first and second water stop parts that are respectively in close contact with respective ones of the first and second protruding parts.

14. The semiconductor device according to claim 11, wherein the water stop part extends from the first protruding part to the second protruding part so as to fill in an area between the first and second protruding parts.

\* \* \* \* \*